United States Patent

[11] 3,622,902

[72] Inventor Thomas Joseph Thomas
Lewisburg, W. Va.
[21] Appl. No. 880,036
[22] Filed Nov. 26, 1969
[45] Patented Nov. 23, 1971
[73] Assignee The Bendix Corporation

[54] FET DIFFERENTIAL AMPLIFIER
1 Claim, 2 Drawing Figs.

[52] U.S. Cl. .......... 330/30, 330/35
[51] Int. Cl. .......... H03f 3/68
[50] Field of Search .......... 307/279, 304; 330/30, 30 D, 35

[56] References Cited
UNITED STATES PATENTS

| | | | |
|---|---|---|---|
| 3,365,586 | 1/1968 | Billings .......... | 307/279 X |
| 3,431,508 | 3/1969 | Soltz et al. .......... | 330/30 |

*Primary Examiner*—Roy Lake
*Assistant Examiner*—Lawrence J. Dahl
*Attorneys*—Plante, Arens, Hartz, Smith & Thompson, Bruce L. Lamb and William G. Christoforo

ABSTRACT: A differential amplifier for use with electrometers. The input stage employs unmatched field effect transistors for high-input impedance. The circuit is arranged for compensation and adjustment to provide satisfactory operation with unmatched transistors.

INVENTOR
THOMAS J. THOMAS
BY [signature]
ATTORNEY

FET DIFFERENTIAL AMPLIFIER

The present invention relates to differential amplifier circuits. More particularly, it relates to differential amplifier circuits adapted to use in electrometer amplifiers and in which field effect transistors in unmatched pairs may be employed.

The circuit of the invention was devised for particular application as an amplifier of signals produced by flame ionization detectors used in chemical analysis apparatus. In such detectors ions produced by the combustion of hydrogen or other gas are collected and applied to the input of an amplifier which drives an indicating or recording device. A typical detector and explanation of its use is found in U.S. Pat. No. 2,991,158. Characteristically, the signal output of such detectors is a minute current of low potential thus requiring a high input impedance, high gain amplifier for satisfactory operation. Differential amplifiers are commonly used as input stages in electrometer amplifiers to obtain low drift. Also, because of the high input impedance requirements, it was not until field effect transistors (FET's) became available that any enthusiasm was displayed for solid-state electrometer amplifiers. The gain of a field effect transistor varies substantially with ambient temperature and also differs between transistors of same type due to production tolerances so that it has heretofore been necessary to select matched pairs of such transistors for satisfactory operation. Understandably, such a requirement adds materially to the cost of the amplifier.

It is therefore the principal object of this invention to provide a high input impedance amplifier circuit employing field effect transistors which need not be matched pairs.

It is a further object of the invention to provide a method of adjustment of a differential amplifier circuit with unmatched field effect transistors so as to produce an amplifier which is operationally equivalent to a differential amplifier with matched field effect transistors.

Briefly, the invention comprises a two-stage differential amplifier circuit of conventional configuration except for the fact that the input stage includes a differentially adjustable load, an adjustable virtual ground, and a compensating junction formed by short-circuiting the source and drain electrodes of a field effect transistor of the same type as is used in the input stage. The method of adjustment comprises disabling the virtual ground connection and adjusting the differential load so that variations in the power supply voltage have no effect on the amplifier output. Thereafter bias is removed from the amplifier output by adjustment of the virtual ground.

Figures 1, 2:
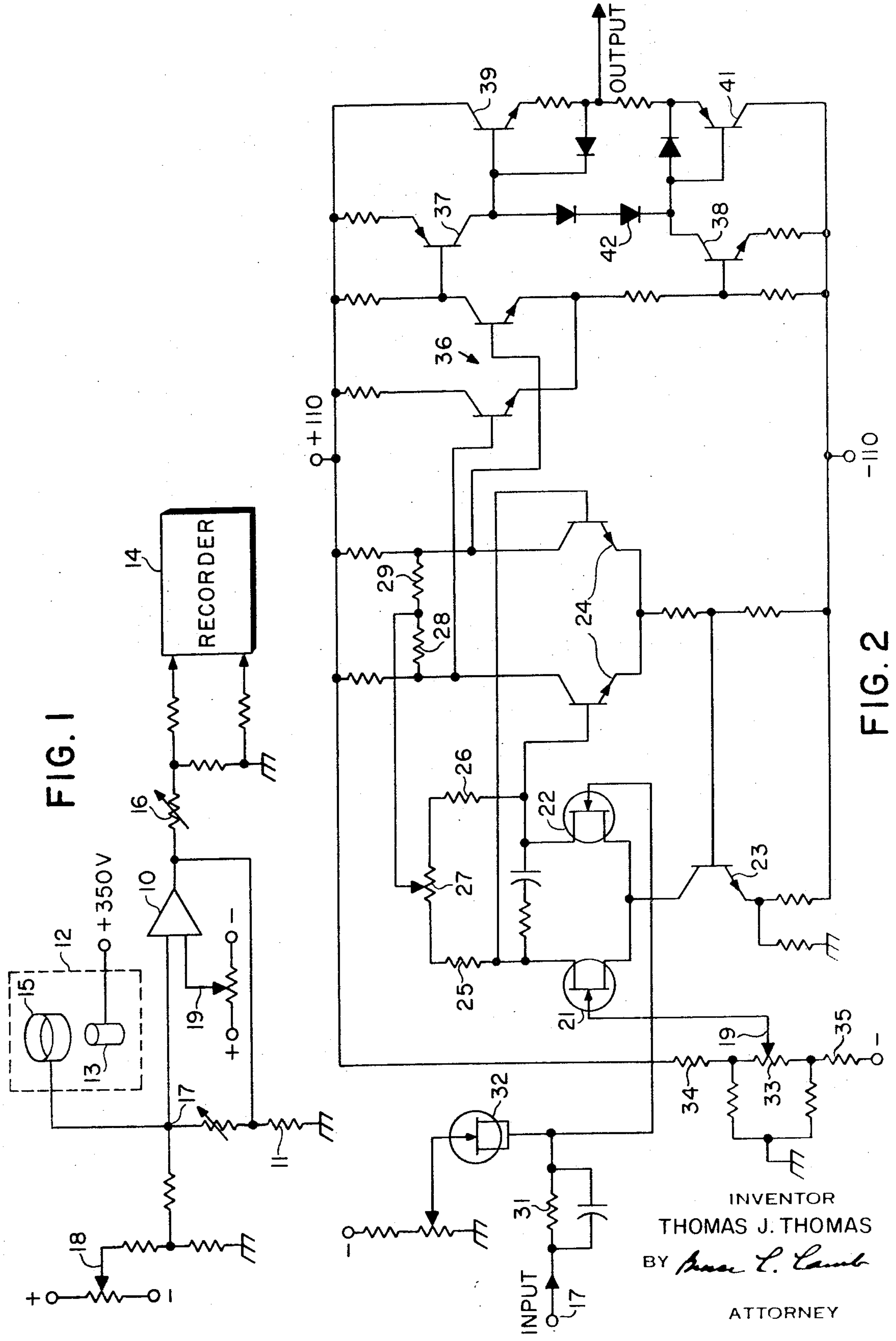
FIG. 1 is a block diagram showing the amplifier in use in an ion gauge.
FIG. 2 is a schematic diagram of the circuit of the invention.

In FIG. 1 the amplifier 10 of the invention is shown in combination with a flame ionization detector cell 12 and a recording voltmeter 14. The cell 12 includes a burner 13 to which a sample gas usually mixed with a flammable carrier gas is conducted and ignited. Ions produced by the combustion are detected in a collector ring 15 which produces a signal current input to amplifier 10. The signal currents are minute, often of the order of 10'7E'12 amperes. Such minute signals require that amplifier 10 be of the differential type which provides a high degree of discrimination against noise. The output of amplifier 10 is fed back negatively to the input through a gain determining network 11. The amplifier output is also applied to recorder 14 through an adjustable attenuator 16. Adjustment of attenuator 16 and network 11 permits a wide range of input signal magnitudes to be recorded at any desired scale. An adjustable amount of bias is applied to input terminal 17 by a bias source 18. Such bias may be required to balance out background current from cell 12. Potentials at the input of amplifier 10 are measured with respect to an adjustable virtual ground 19.

FIG. 2 is a schematic diagram of the circuit of the invention. Field effect transistors (FET) 21, 22 are connected in a generally conventional differential amplifier circuit configuration. The source electrodes of both transistors are connected together and returned to a negative 110 v. DC supply through a bipolar transistor 23. Transistor 23 is controlled by a differential amplifier which includes a dual bipolar transistor 24 connected in cascade with the stage comprised by FET 21 and 22. Differential amplifiers including two cascaded stages and the feedback stage, similar to transistor 23, are known and have heretofore been used to take advantage of the exceptionally high "common mode" rejection afforded by the high dynamic resistance of the feedback stage 23. Transistor 23 therefore possesses the characteristics of a constant current source which ensures that a signal common to the inputs of both FETs 21, 22 will have practically no effect on the amplifier output. The drain electrodes of FETs 21 and 22 are connected through load resistors 25 and 26 to opposite ends of a potentiometer 27. The variable tap of potentiometer 27 is connected to the junction of equal valued resistors 28, 29 connected between the collectors of dual transistor 24. The differential between the output voltages of the collectors of transistor 24 is not reflected to the FET stage since junction 29 remains at a substantially constant voltage despite input signal variations.

The signals combined at input junction 17 are applied through an isolating network 31 to the gate electrode of FET 22. Also present at this electrode is a temperature compensating bias input produced by an FET 32 of the same type as FET 22 with its source and drain electrodes short-circuited and its gate electrode supplied from an adjustable negative voltage source. The gate electrode of FET 21 is connected to a virtual ground provided by a potentiometer 33 connected across positive and negative voltage dividers 34, 35. Adjustment of the arm of potentiometer 33 provides a voltage of small magnitude but of either of the polarities required to adjust for differences between the characteristics of FET 21 and FET 22.

The output of the double stage differential amplifier comprising FET 21, 22 and transistor 24 appears as a differential voltage at the collectors of dual transistor 24. These outputs are applied to a conventional differential amplifier stage 36 which supplies complementary driver transistors 37 and 38. Transistors 39 and 41 each of opposite conductivity type to its preceding transistor 37, 38 are connected as emitter followers to supply push-pull output to the recorder. Diodes 42 couple signal from the collector of transistor 37 to the base of transistor 41 to cause cutoff in the latter transistor during that portion of the signal excursion which causes transistor 37 to conduct. When the input signal changes so that transistor 37 is no longer sufficiently conductive to drive transistor 39, transistor 38, being supplied from a substantially constant voltage source in the emitter circuit of amplifier 36, becomes conductive to swing the output current in the opposite direction.

In the circuit just described FET 21 and 22 need not be matched pairs. Instead transistors of the same nominal characteristics but having the usual differences in characteristics due to production tolerances may be employed and the following method of initially adjusting the circuit provides compensation for variances in these transistors over a wide range of ambient temperature and input signal magnitude. The method of adjustment comprises, after the circuit is completely assembled, temporarily connecting input 17 and virtual ground 19 to circuit ground. The positive and negative voltage supplies are then varied through a range of approximately 10 percent and potentiometer 27 is adjusted to a point at which no variation is noted in the amplifier output when the power-supply voltage is varied. The output voltage will usually not then be 0 with the input grounded. Next the circuit ground is removed from virtual ground 19 and the latter is adjusted to eliminate any offset from 0 in the output voltage. Finally, the bias source of transistor 32 is adjusted to obtain 0 input current to the amplifier. Upon removal of the input circuit ground, the amplifier may be placed in service.

The invention claimed is:

1. In a differential amplifier having a power source of positive and negative voltages including a pair of field effect transistors of generally similar characteristics as active input elements, the improvements for equalizing differences between said transistors and stabilizing amplifier operation, comprising a differentially adjustable load in the output circuit of each of said transistors whereby an increase in the load of one of said transistors simultaneously reduces the load of the other of said transistors;

a signal source connected to the input to one of said transistors;

an adjustable virtual ground connected to the input of the other of said transistors; said virtual ground including a voltage divider connected across said positive and negative voltage source and an adjustable terminal on said divider positioned near the point on said divider possessing 0 electrical potential; and a third field effect transistor having characteristics generally similar to said pair of transistors and having source, drain and gate electrodes, said source and drain electrodes being connected together and to the input of one of said pair of transistors, and means for adjustably biasing said gate electrode whereby said third transistor provides a source of current responsive to ambient temperature variations to compensate for amplifier gain variations.

* * * * *